US012804808B2

(12) United States Patent
Wang et al.

(10) Patent No.: US 12,804,808 B2
(45) Date of Patent: Nov. 17, 2026

(54) FABRIC TOUCH PANEL

(71) Applicant: WUYI UNIVERSITY, Jiangmen (CN)

(72) Inventors: Fei Wang, Jiangmen (CN); Juejing Dai, Jiangmen (CN); Jiehong Zheng, Jiangmen (CN); Xi Wang, Jiangmen (CN); Hui Yu, Jiangmen (CN)

(73) Assignee: WUYI UNIVERSITY, Jiangmen (CN)

( * ) Notice: Subject to any disclaimer, the term of this patent is extended or adjusted under 35 U.S.C. 154(b) by 211 days.

(21) Appl. No.: 18/802,142

(22) Filed: Aug. 13, 2024

(65) Prior Publication Data

US 2025/0240885 A1 Jul. 24, 2025

(51) Int. Cl.
*H05K 1/03* (2006.01)
*G06F 3/041* (2006.01)
*G06F 3/045* (2006.01)

(52) U.S. Cl.
CPC ........... *H05K 1/038* (2013.01); *G06F 3/0414* (2013.01); *G06F 3/045* (2013.01)

(58) Field of Classification Search
CPC .... G06F 3/0414; G06F 3/045; G06F 3/04144; G06F 3/0446; G06F 3/0547; H05K 1/038
See application file for complete search history.

(56) References Cited

U.S. PATENT DOCUMENTS 4,659,873 A * 4/1987 Gibson .................. H01H 3/141 178/18.05
5,432,304 A * 7/1995 Tanahashi ............... G06F 3/045 178/18.05
2007/0056493 A1 * 3/2007 Burkitt .................. G06F 3/0221 112/401
2019/0004635 A1 * 1/2019 Sawyer ................ H04R 1/1041
2019/0331540 A1 * 10/2019 Wang ..................... C08G 77/04

* cited by examiner

*Primary Examiner* — Paresh Paghadal
(74) *Attorney, Agent, or Firm* — Vivacqua Crane, PLLC

(57) ABSTRACT

A fabric touch panel, includes an upper conductor layer, a middle conductor layer, and a lower conductor layer, the middle conductor layer being a good conductor layer. When the fabric touch panel is subjected to an external force, a first good conductor is in contact with the middle conductor layer, such that a first semiconductor and the middle conductor layer form a first conductive path, and a first conductive resistance value obtained by conduction of the first conductive path uniquely corresponds to a coordinate in a first direction of a plane; and a second good conductor is in contact with the middle conductor layer, such that a second semiconductor and the middle conductor layer form a second conductive path, and a second conductive resistance value obtained by conduction of the second conductive path uniquely corresponds to a coordinate in a second direction of the plane.

6 Claims, 2 Drawing Sheets

FABRIC TOUCH PANEL

CROSS-REFERENCE TO RELATED APPLICATION

This application is based on and claims the benefit of priority from Chinese Patent Application No. 202410090754.4, filed on 22 Jan. 2024, the entirety of which is incorporated by reference herein.

TECHNICAL FIELD

Embodiments of the disclosure relate to, but are not limited to, the technical field of smart textiles, and in particular, to a fabric touch panel.

BACKGROUND

With the development of science and technology, intelligentization is entering people's daily lives. This has given rise to many hybrid products that combine textile products with electronic devices. The fabric touch technology is particularly important. In the future smart textile industry, fabric touch technology will play an important role equivalent to the keyboard and mouse in contemporary electronic computers. Therefore, fabric touch technology is one of the important technologies in the smart textile industry.

The current fabric touch panel generally includes an upper conductor layer, a middle conductor layer, and a lower conductor layer. When subjected to pressure, the upper conductor layer and the lower conductor layer achieve are conducted through the middle conductor layer at a pressure position, such that a resistance signal of the middle conductor layer is measured through the upper conductor layer and the lower conductor layer. However, this technology requires that the resistances of the middle conductor layer at various positions in a plane are different, so as to identify the pressure position. The middle conductor layer yet requires the preparation of special yarn or a plurality of repeated printings to realize that the resistances of the middle conductor layer at various positions in the plane are different, which makes the processing difficult. Therefore, how to develop a fabric touch panel with a simple structure and easy processing has become an urgent technical problem to be solved.

SUMMARY

The following is a summary of the subject matter described in detail herein. This summary is not intended to limit the scope of protection of the claims.

An embodiment of the disclosure provides a fabric touch panel. Compared with the existing technology, the entire middle conductor layer is a good conductor layer, and the entire fabric touch panel has the advantages of simple structure and easy processing.

In a first aspect, an embodiment of the disclosure provides a fabric touch panel, including: an upper conductor layer, a middle conductor layer, and a lower conductor layer, where the upper conductor layer includes a first semiconductor and a first good conductor drawn out from the first semiconductor, the lower conductor layer includes a second semiconductor and a second good conductor drawn out from the second semiconductor, the middle conductor layer is a good conductor layer. When the fabric touch panel is not subjected to an external force, both the upper conductor layer and the lower conductor layer remain isolated from the middle conductor layer. When the fabric touch panel is subjected to an external force, the first good conductor is in contact with the middle conductor layer, such that the first semiconductor and the middle conductor layer form a first conductive path, and a first conductive resistance value obtained by conduction of the first conductive path uniquely corresponds to a coordinate in a first direction of a plane; the second good conductor is in contact with the middle conductor layer, such that the second semiconductor and the middle conductor layer form a second conductive path and a second conductive resistance value obtained by conduction of the second conductive path uniquely corresponds to a coordinate in a second direction of the plane. The first direction of the plane and the second direction of the plane are different, and coordinates where the external force is applied are determined based on the coordinate in the first direction of the plane and the coordinate in the second direction of the plane.

In some embodiments, the middle conductor layer includes an upper middle conductor layer and a lower middle conductor layer, an elastic dielectric layer is arranged between the upper middle conductor layer and the lower middle conductor layer, and the upper middle conductor layer, the lower middle conductor layer and the elastic dielectric layer form a plate capacitor with a three-layer structure.

In some embodiments, the middle conductor layer includes an upper middle conductor layer and a lower middle conductor layer, an elastic piezoresistive layer is arranged between the upper middle conductor layer and the lower middle conductor layer, and the upper middle conductor layer, the lower middle conductor layer and the elastic piezoresistive layer form a piezoresistive pressure sensor with a three-layer structure.

In some embodiments, the middle conductor layer includes an upper middle conductor layer and a lower middle conductor layer, an elastic piezoresistive layer is arranged between the upper middle conductor layer and the lower middle conductor layer, and the upper middle conductor layer, the lower middle conductor layer and the elastic piezoresistive layer form a piezoresistive pressure sensor with a three-layer structure.

In some embodiments, the first good conductor comprises a plurality of first good conductors separated from each other; and/or the second good conductor comprises a plurality of second good conductors separated from each other.

In some embodiments, at least one of the upper conductor layer and the lower conductor layer has a non-conductive protrusion structure.

In some embodiments, elastic isolation layers are respectively provided between the middle conductor layer and the upper conductor layer and between the middle conductor layer and the lower conductor layer, and the elastic isolation layers are provided with through holes, such that when the fabric touch panel is subjected to an external force, the upper conductor layer and the lower conductor layer are in contact with the middle conductor layer through the through holes.

In some embodiments, the first good conductor comprises a plurality of first good conductors sequentially drawn out from different positions of the first semiconductor, such that resistance values drawn out by each of the first good conductors are different; and/or the second good conductor comprises a plurality of second good conductors sequentially drawn out from different positions of the second semiconductor, such that resistance values drawn out by each of the second good conductors are different.

In some embodiments, the first semiconductor, the second semiconductor, the first good conductor, the second good conductor and the middle conductor layer are made of any one of conductive film material, conductive composite material, conductive fiber material, and conductive fiber assembly material.

In some embodiments, the first semiconductor, the second semiconductor, the first good conductor and the second good conductor form a conductive portion with a specific pattern on a surface or middle portion of a substrate by any of screen printing, stencil printing, spraying, thermal bonding, weaving, knitting, sewing, and embroidery; or, the first semiconductor, the second semiconductor, the first good conductor and the second good conductor are double-layer or multi-layer flexible conductive films obtained by using any of deposition, chemical plating, and electrochemical plating.

A fabric touch panel provided by an embodiment of the disclosure includes: an upper conductor layer, a middle conductor layer, and a lower conductor layer. The upper conductor layer includes a first semiconductor and a first good conductor drawn out from the first semiconductor, the lower conductor layer includes a second semiconductor and a second good conductor drawn out from the second semiconductor, the middle conductor layer is a good conductor layer. When the fabric touch panel is not subjected to an external force, both the upper conductor layer and the lower conductor layer remain isolated from the middle conductor layer. When the fabric touch panel is subjected to an external force, the first good conductor is in contact with the middle conductor layer, such that the first semiconductor and the middle conductor layer form a first conductive path, and a first conductive resistance value obtained by conduction of the first conductive path uniquely corresponds to a coordinate in a first direction of a plane; the second good conductor is in contact with the middle conductor layer, such that the second semiconductor and the middle conductor layer form a second conductive path, and a second conductive resistance value obtained by conduction of the second conductive path uniquely corresponds to a coordinate in a second direction of the plane. The first direction of the plane and the second direction of the plane are different, and coordinates where the external force is applied are determined based on the coordinate in the first direction of the plane and the coordinate in the second direction of the plane. Based on this, the fabric touch panel of the disclosure is easy to process. Compared with the existing technology that uses cumbersome processes to produce a special middle layer with different resistances at different positions, the middle conductor layer used in the disclosure is a good conductor layer as a whole. When the fabric touch panel is subjected to an external force, a first conductive path is defined from the first semiconductor in the upper conductor layer to the middle conductor layer, and a second conductive path is defined from the second semiconductor in the lower conductor layer to the middle conductor layer. Since the first conductive resistance value obtained by conduction of the first conductive path uniquely corresponds to a coordinate in the first direction of the plane, the coordinate in one direction is reflected. In the same way, the resistance value of the second conductive path reflects the coordinate in another direction. By combining the respective conductive resistance values of the first conductive path and the second conductive path, the plane coordinates where the external force is applied can be obtained, such that the pressed plane position can be accurately identified. Therefore, compared with the existing technology, the disclosure has the advantages of simple structure and easy processing.

Additional features and advantages of the disclosure will be set forth in the specification which follows, and in part will be apparent from the specification, or may be learned by practice of the disclosure. The objectives and other advantages of the disclosure may be realized and obtained by the structure particularly pointed out in the description, claims and accompanying drawings.

BRIEF DESCRIPTION OF DRAWINGS

The accompanying drawings are used to provide a further understanding of the technical solution of the disclosure and constitute a part of the specification, and together with the embodiments of the disclosure, are used to explain the technical solution of the disclosure and do not constitute a limitation of the technical solution of the disclosure.

DETAILED DESCRIPTION

Figure 1:
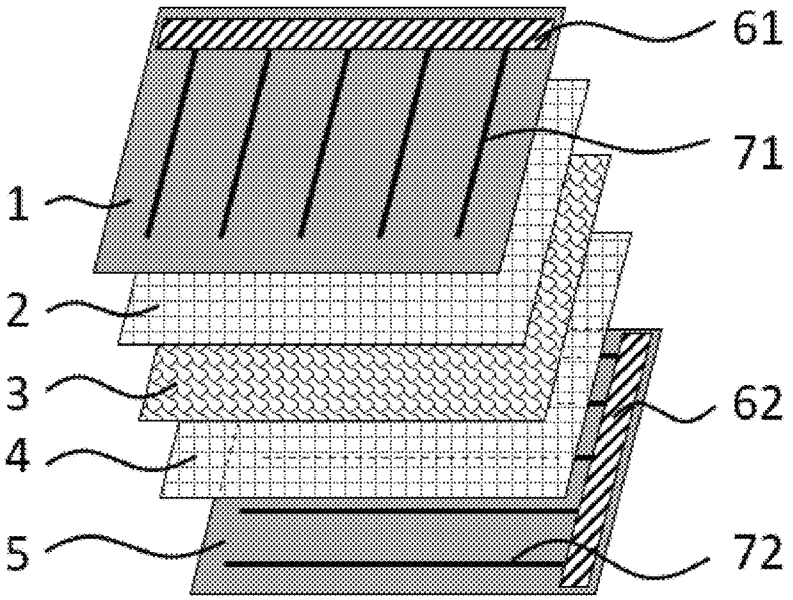
FIG. 1 is a schematic three-dimensional exploded structural view of a fabric touch panel in a plane coordinate system provided by Embodiment 1 of the disclosure.

In order to make the objectives, technical solutions and advantages of the disclosure clearer and more understandable, the disclosure will be further described in detail below in conjunction with the accompanying drawings and embodiments. It should be understood that the specific embodiments described here are merely used to explain the disclosure and are not intended to limit the disclosure.

It should be understood that in the description of the embodiments of the disclosure, the meaning of "a plurality of (or multiple)" refers to two or more. The terms such as "greater than", "less than", "over" are understood not to include the specified number, while the terms such as "above", "below", "within" are understood to include the specified number. If described, the terms such as "first", "second" are merely for the purpose of distinguishing technical features, and not to be construed as indicating or implying relative importance or implicitly indicating the number of technical features indicated or implicitly indicating the precedence relationship of technical features indicated.

In order to solve the technical problem of high processing difficulty in the existing technology, an embodiment of the disclosure provides a fabric touch panel, including: an upper conductor layer, a middle conductor layer, and a lower conductor layer. The upper conductor layer includes a first semiconductor and a first good conductor drawn out from the first semiconductor. The lower conductor layer includes a second semiconductor and a second good conductor drawn out from the second semiconductor. The middle conductor layer is a good conductor layer. When the fabric touch panel is not subjected to an external force, both the upper conductor layer and the lower conductor layer remain isolated from the middle conductor layer. When the fabric touch panel is subjected to an external force, the first good conductor is in contact with the middle conductor layer, such that the first semiconductor and the middle conductor layer form a first conductive path, and a first conductive resistance value obtained by conduction of the first conductive path uniquely corresponds to a coordinate in a first direction of a plane; the second good conductor is in contact with the middle conductor layer, such that the second semiconductor and the middle conductor layer form a second conductive path, and a second conductive resistance value obtained by conduction of the second conductive path uniquely corresponds to a coordinate in a second direction of the plane. The first direction of the plane and the second direction of the plane are different, and coordinates where the external force is applied are determined based on the coordinate in the first direction of the plane and the coordinate in the second direction of the plane. Based on this, the fabric touch panel of the disclosure is easy to process. Compared with the existing technology that uses cumbersome processes to produce a special middle layer with different resistances at different positions, the middle conductor layer used in the disclosure is a good conductor layer as a whole. When the fabric touch panel is subjected to an external force, a first conductive path is defined from the first semiconductor in the upper conductor layer to the middle conductor layer, and a second conductive path is defined from the second semiconductor in the lower conductor layer to the middle conductor layer. Since the first conductive resistance value obtained by conduction of the first conductive path uniquely corresponds to a coordinate in the first direction of the plane, the coordinate in one direction is reflected. In the same way, the resistance value of the second conductive path reflects the coordinate in another direction. By combining the respective conductive resistance values of the first conductive path and the second conductive path, the plane coordinates where the external force is applied can be obtained, such that the pressed plane position can be accurately identified. Therefore, compared with the existing technology, the disclosure has the advantages of simple structure and easy processing.

The main body structures of the disclosure are all made of textile materials and can be divided into an upper conductor portion, a middle conductor portion and a lower conductor portion according to the functions, hereafter referred to as the upper conductor layer, the middle conductor layer, and the lower conductor layer. The conductive material of the upper conductor layer includes a first semiconductor and a good conductor. There are one or more good conductors that are drawn out from different positions of the first semiconductor. The plurality of good conductors do not contact each other. Similarly, the lower conductor layer also includes a second semiconductor and a good conductor. There are one or more good conductors that are drawn out from different positions of the second semiconductor. The plurality of good conductors do not contact each other. The resistivities of the first semiconductor and the second semiconductor may be different or the same. The middle conductor layer is a good conductor layer as a whole. It should be ensured that when the external force is absent, the resistance between the upper conductor layer and the middle conductor layer is infinite, and the resistance between the lower conductor layer and the middle conductor layer is infinite. For this purpose, an isolation layer is selectively intervened between the upper conductor layer and the middle conductor layer and between the lower conductor layer and the middle conductor layer. The isolation layers are provided with through holes, such that when subjected to pressure, traces of the good conductors in the upper conductor layer or the lower conductor layer are in contact with the middle conductor layer through the through holes, thereby forming two conductive paths. The first conductive path is from the semiconductor in the upper conductor layer to the middle conductor layer, and the second conductive path is from the semiconductor in the lower conductor layer to the middle conductor layer. Since the traces of the good conductors in the upper conductor layer are drawn out from different positions of the semiconductor, the resistance value of the first conductive path reflects which specific good conductor in the upper conductor layer is connected to the first conductive path, thereby reflecting the coordinate in one direction. In the same way, the resistance value of the second conductive path reflects the coordinate in another direction. By combining the resistance values of the first conductive path and the second conductive path, the plane coordinates of the pressed position can be obtained. In addition to selectively intervening isolation layers, the upper conductor layer and the lower conductor layer can also have three-dimensional structures themselves, such as including non-conductive protrusions to support that the upper conductor layer or the lower conductor layer stays separated from the middle conductor layer, such that no isolation layer is required. It should be noted that in some specific situations, the middle conductor layer can also contain three sub-layers, and the middle conductor layer can realize the functions of a capacitive pressure sensor, a resistive pressure sensor or a piezoelectric pressure sensor.

It should be noted that the application products of the disclosure are smart textiles, including but not limited to smart clothing, smart home furnishings, smart home textiles, smart car accessories, smart textile toys, etc. As an input terminal of the above products, the disclosure can provide single-point pressing position information for intelligent devices.

In an embodiment, the upper conductor layer, the lower conductor layer and the possible additional elastic isolation layers are all made of textile materials, and therefore, possess the advantages of softness, flexibility, washability, and dryability that are characteristic of wearable textiles.

In an embodiment, the patterns of the semiconductors and good conductors in the conductor layers may be of any shape, as long as the traces of the good conductors in the upper conductor layer are not in contact with each other, and the traces of the good conductors in the lower conductor layer are not in contact with each other. The patterns may be customized according to user needs, such as straight lines, wavy shapes, curves, triangles, rectangles, squares or artistic patterns, etc.

In an embodiment, the good conductors in the upper conductor layer are sequentially drawn out from a first semiconductor pattern, and the good conductors in the lower conductor layer are sequentially drawn out from a second semiconductor pattern, thereby forming a correspondence relationship between the traces of the good conductors and the resistances.

In an embodiment, the first semiconductor in the upper conductor layer, the second semiconductor in the lower conductor layer, the respective good conductors in the upper and lower conductor layers, and the entire middle conductor layer may be made of conductive film materials, conductive composite materials, conductive fiber materials, or conductive fiber assembly materials, preferably flexible conductive polymer materials or conductive composite materials, such as graphene-doped polyimide films, carbon nanotube-doped polyethylene terephthalate films, and carbon fibers. The semiconductors and good conductors in the conductor layers may form a conductive portion with a specific pattern on a surface or middle portion of a substrate by the methods such as screen printing, stencil printing, spraying or thermal bonding, weaving, knitting, sewing or embroidery, including not only the good conductors, but also the first semiconductor and the second semiconductor. A double-layer or multi-layer flexible conductive film may also be obtained by means of deposition, chemical plating, electrochemical plating, etc. Certainly, the upper conductor layer and the lower conductor layer may also be fabrics with metal coatings or conductive composite material coatings or intrinsic conductive polymer coatings, fabrics woven or knitted from conductive fibers, or fabrics blended from conductive fibers and non-conductive fibers. The middle conductor layer may also obtain conductive properties through the above method. Preferably, the resistance of the middle conductor layer should be kept at the same level as that of the good conductor.

In an embodiment, the isolation between the upper conductor layer and the lower conductor layer can be achieved by additional elastic isolation layers with through holes, or by a non-conductive protrusion structure provided by the upper conductor layer or the lower conductor layer itself.

In an embodiment, in a five-layer structure considering possible additional isolation layers, the upper conductor layer also needs to have the following characteristics. The first characteristic is that since the semiconductor and the good conductors are added to the conductor layer, different good conductors should not be in contact with each other to avoid errors. The second characteristic is that the resistance characteristics of the semiconductor itself should be to ensure constant resistance, such that the resistances at different distances will show linear characteristics.

In an embodiment, the spatial resolution of a touch device may be achieved by changing the pattern distribution density of the good conductors in the upper conductor layer and the pattern distribution density of the good conductors in the lower conductor layer, which may vary with the size of the through holes in the elastic isolation layers, or with the density of the non-conductive protrusions in the upper conductor layer and the lower conductor layer.

In an embodiment, the press sensitivity of the fabric touch panel can be adjusted by the number of first good conductors, the number of second good conductors, and the intersection positioning points of the first good conductors and the second good conductors. Furthermore, when the fabric touch panel does not have the elastic isolation layers but has a non-conductive protrusion structure, the pressing sensitivity of the touch device can be adjusted by means of the number and intersection positioning points of good conductors in the upper conductor layer and the lower conductor layer, in combination with the size and density of the non-conductive protrusions. When the fabric touch panel has the elastic isolation layers, the pressing sensitivity of the touch device can be adjusted by means of the number and intersection positioning points of good conductors in the upper conductor layer and the lower conductor layer, in combination with the thickness and elastic modulus of the elastic isolation layers, as well as the size and shape of the through holes.

In an embodiment, the additional elastic isolation layers may be films or fabrics (woven fabrics, knitted fabrics, braided fabrics or non-woven fabrics), may be made of silicone, polyurethane, or other elastic polymer materials, and thus have the characteristics of being elastic, and also bent and stretched at will. For example, the additional elastic isolation layers may be elastic mesh fabrics, elastic net fabrics, or loose-structured elastic fabrics made of elastic fibers. In addition, the additional isolation layers are made into a hole shape or a mesh shape to limit the touch position and avoid touching non-functional areas. This function can also be realized by the non-conductive protrusions of the upper conductor layer or the lower conductor layer itself, including protrusions made of woven or knitted fibers, and protrusions dispensed by silicone and polymer materials, etc.

In an embodiment, the upper conductor layer, the middle conductor layer, the lower conductor layer and the optional elastic isolation layers may be bonded with adhesives, hot-melt films, etc., but it should be noted that the adhesives, hot-melt films, etc. cannot cover a semiconductor working area to avoid the formation of an insulating layer between the two layers that affects the functional use. The above portions can also be integrated by sewing, or three-dimensional weaving or knitting technology can be used to directly weave or knit the upper and lower conductor layers into a whole.

In an embodiment, the upper conductor layer, the middle conductor layer, the lower conductor layer and the optional elastic isolation layers are not limited to planar structures, but can also be curved structures, which can better fit curved objects such as human bodies, and can even be processed into a three-dimensional structure to cover three-dimensional objects, thereby forming three-dimensional single-point perception.

In an embodiment, in some specific situations, the middle conductor layer may be divided into an upper middle conductor layer and a lower middle conductor layer, between which an elastic dielectric layer is provided, thereby forming a plate capacitor with a three-layer structure. Since pressure will cause the thickness of the elastic dielectric layer to become thinner, i.e., cause the distance between the upper middle conductor layer and the lower middle conductor layer to decrease and the capacitance value to increase, the pressure can be sensed by detecting changes in the capacitance of the plate capacitor. When the middle conductor layer is the plate capacitor with a three-layer structure, the measurement of a plane coordinate position will not be affected. However, the touch panel requires a total of four wires at this time. The first wire is connected to the semiconductor of the upper conductor layer, the second wire is connected to the upper middle conductor layer of the middle conductor layer, the third wire is connected to the lower middle conductor layer of the middle conductor layer, and the fourth wire is connected to the semiconductor of the lower conductor layer. The coordinate in one direction can be obtained through a circuit formed by the first wire and the second wire, a pressure value can be obtained through a circuit formed by the second wire and the third wire, and the coordinate in another direction can be obtained through a circuit formed by the third wire and the fourth wire. Therefore, in this case, the fabric touch panel can sense both the coordinates where the force is applied and the magnitude of the applied force. The elastic dielectric layer may be a polymer insulating material, a polymer fiber textile, a polymer composite material filled with conductive particles, or a polymer fiber textile containing conductive particles.

In an embodiment, in some specific situations, the middle conductor layer may also be divided into an upper middle conductor layer and a lower middle conductor layer, between which an elastic piezoresistive layer is provided, thereby forming a piezoresistive pressure sensor with a three-layer structure. Since pressure will cause the resistance of the elastic piezoresistive layer to become smaller, the pressure can be sensed by detecting changes in the internal resistance of the middle conductor layer. When the middle conductor layer is the piezoresistive sensor with a three-layer structure, the measurement of a plane coordinate position will not be affected. However, the touch panel requires a total of four wires at this time. The first wire is connected to the semiconductor of the upper conductor layer, the second wire is connected to the upper middle conductor layer of the middle conductor layer, the third wire is connected to the lower middle conductor layer of the middle conductor layer, and the fourth wire is connected to the semiconductor of the lower conductor layer. The coordinate in one direction can be obtained through a circuit formed by the first wire and the second wire, a pressure value can be obtained through a circuit formed by the second wire and the third wire, and the coordinate in another direction can be obtained through a circuit formed by the third wire and the fourth wire. Therefore, in this case, the fabric touch panel can sense both the coordinates where the force is applied and the magnitude of the applied force. The elastic piezoresistive layer may be an elastic polymer composite containing conductive particles (such as graphite, nano-silver wires, carbon nanotubes, and graphene), a knitted textile or elastic non-woven fabric with a conductive coating, or an elastic textile or elastic non-woven fabric made of semiconductor conductive fibers.

In an embodiment, in some specific situations, the middle conductor layer may also be divided into an upper middle conductor layer and a lower middle conductor layer, between which a piezoelectric layer is provided, thereby forming a piezoelectric pressure sensor with a three-layer structure. The magnitude of the pressure is reflected by a piezoelectric signal. In this way, pressure and position measurements can also be achieved simultaneously. The piezoelectric layer may be a piezoelectric polymer or a textile made thereof (such as polyvinylidene fluoride fiber non-woven fabric), a piezoelectric composite material or a textile made thereof (such as nano piezoelectric ceramics and textiles made of polyurethane spinning).

The embodiments of the disclosure will be further described below in conjunction with the accompanying drawings.

Embodiment 1

Referring to FIG. 1, this embodiment provides a single-point pressure fabric touch panel that can identify horizontal and vertical coordinates in a Cartesian plane coordinate system. The main body of the touch panel is made of textile materials. The touch panel is composed of an upper conductor layer 1, an elastic isolation layer 2, a middle conductor layer 3, an elastic isolation layer 4, and a lower conductor layer 5. The upper conductor layer 1 is provided with a first semiconductor 61 and first good conductors 71 drawn out from the first semiconductor 61. The lower conductor layer 5 is provided with a second semiconductor 62 and second good conductors 72 drawn out from the second semiconductor 62. The isolation layer 2 is provided between the upper conductor layer 1 and the middle conductor layer 3, and through holes are provided in the isolation layer. The isolation layer 4 is provided between the lower conductor layer 5 and the middle conductor layer 3, and through holes are provided in the isolation layer. The semiconductors 61, 62 and the good conductors 71, 72 are arranged on merely one side of each of the upper conductor layer 1 and the lower conductor layer 5, that is, on the lower surface of the upper conductor layer and the upper surface of the lower conductor layer.

The first good conductors 71 and the second good conductors 72 may be made of metal-plated conductive fabrics such as copper-plated conductive fabrics, silver-plated conductive fabrics and other conductive fabrics containing metal components. Non-conductive fabrics are made of polyester plain woven fabric. The elastic isolation layer 2 and the elastic isolation layer 4 select warp-knitted elastic knitted fabrics from polyurethane filaments. The first semiconductor 61 is preferably made of polyimide composite materials doped with graphene. The recommended length resistance range of the first semiconductor 61 of the upper conductor layer 1 and the second semiconductor 62 of the lower conductor layer 5 is 1000-10000 ohms per centimeter. The elastic isolation layer 2 and the elastic isolation layer 4 are selected from elastic structures printed from thermoplastic elastomers of the styrenic block copolymer type. The adhesive is a hot-melt polyurethane film but cannot cover the semiconductors and good conductors in the upper and lower conductor layers, otherwise a circuit break will occur. Therefore, five layers of materials may be sewn together in a non-touch area, which can avoid the occurrence of circuit break.

This embodiment also has another typical textile material system. For example, silver-plated nylon yarns are embroidered on the surface of polyester twill woven fabrics as the traces of good conductors, and then graphene-coated nylon yarns are embroidered as semiconductors, such that the upper conductor layer 1 and the lower conductor layer 5 can be formed respectively. The middle conductor layer 3 is directly made of copper-nickel-plated polyester knitted plain fabrics. The elastic isolation layer 2 and the elastic isolation layer 4 are directly made of mesh knitted fabrics for socks. Finally, these materials are sewn together to form a single-point pressure fabric touch device.

When the external pressure is absent, the upper conductor layer 1 and the middle conductor layer 3 will be separated by the middle elastic isolation layer 2, and the lower conductor layer 5 and the middle conductor layer 3 will also be separated by the elastic isolation layer 4 in the middle. When pressed by an external force, the first good conductor 71 in the upper conductor layer 1 is in contact with the middle conductor layer 3, thereby forming a first conductive path between the first semiconductor 61 and the middle conductor layer 3. Meanwhile, the second good conductor 72 in the lower conductor layer 5 is also in contact with the middle conductor layer 3, thereby forming a second conductive path between the second semiconductor 62 and the middle conductor layer 3. The first semiconductor 61 is on the lower surface of the upper fabric layer, and is equally divided into five parts, with each part having a resistance of 1 kΩ. Similarly, the second semiconductor 62 is on the right side of the lower fabric layer, and is equally divided into five parts, with each part having a resistance of 1 kΩ. For example, when the resistance of the first conductive path is 5 kΩ, the first conductive path corresponds to the position of the fifth first good conductor 71 in the upper conductor layer 1, that is, the abscissa can be measured. In the same way, the ordinate can be measured through the resistance of the second conductive path.

It should be noted that the above embodiment can only detect the intersection position of the upper and lower good conductors. If only one good conductor is pressed or the fabric layer itself is pressed, the data will be inaccurate. Therefore, the number of good conductors in the upper and lower fabric layers may be increased as needed to obtain more intersection points, such that fine position information can be measured. It is noted that the shape of the good conductors 7 may be diversified, and the required conductor pattern may be designed according to the actual situation. Traces of good conductors on the same layer cannot contact each other.

Embodiment 2

Figure 2:
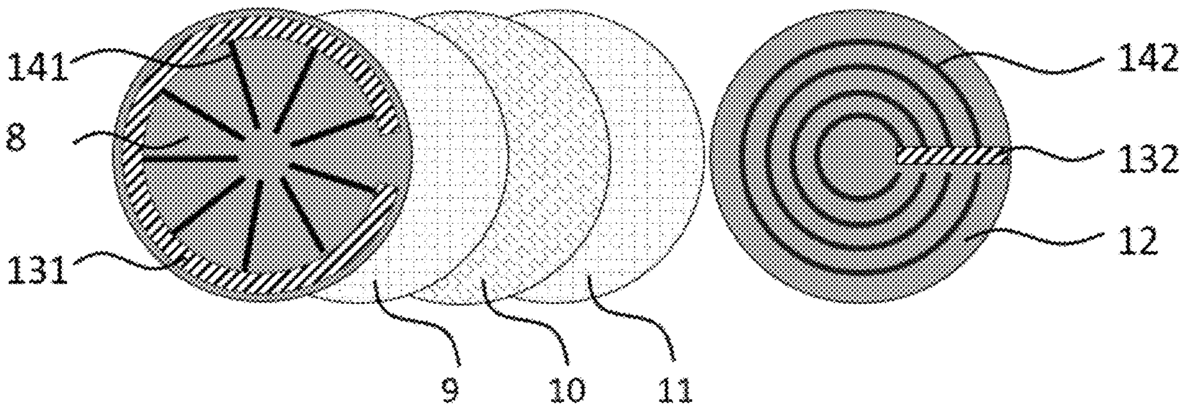
FIG. 2 is a schematic three-dimensional exploded structural view of a fabric touch panel in a polar coordinate system provided by Embodiment 2 of the disclosure.

Referring to FIG. 2, this embodiment provides a circular single-point pressure touch panel. A five-layer structure is adopted, including an upper conductor layer 8, an elastic isolation layer 9, a middle conductor layer 10, an elastic isolation layer 11, and a lower conductor layer 12. The first semiconductor 131 made of a graphite silicone composite material and the first good conductors 141 made of a multi-walled carbon nanotube silicone composite material are screen-printed on the surface of the gold-edged plain nylon fabric of the upper conductor layer 8. The first semiconductor 131 is arranged around the circumference of the circular fabric, and the first good conductors 141 are arranged radially from the center of the circle outward and are electrically connected to the first semiconductor 131. The second semiconductor 132 made of a carbon black silicone composite material and the second good conductors 142 made of a nano-silver wire polyurethane composite material are screen-printed on the surface of the warp-knitted plain nylon fabric of the lower conductor layer 12. The second semiconductor 132 is arranged on the right side of the circle, corresponding to the opening position of the first semiconductor 131 in the middle of the upper conductor layer 8. The second good conductors 142 are arranged in concentric circles and are electrically connected to the second semiconductor 132 respectively. The elastic isolation layer 9 and the elastic isolation layer 11 are both made of mesh fabrics composed of nylon spandex warp-knitted elastic knitted fabrics. The five layers are bonded together with adhesives that are applied merely to areas free of conductive materials, so as to avoid the formation of a circuit break. The main idea of this embodiment is different from the Embodiment 1. The Embodiment 1 adopts the Cartesian plane coordinate system, while the Embodiment 2 adopts a polar coordinate system. That is, the upper conductor layer 8 identifies angle information, and the lower conductor layer 12 identifies radius information. Combining these two pieces of information, any position within the circular plane can be identified.

It should be noted that the elastic isolation layer 9 and the elastic isolation layer 11 are not necessary. Silica gel may also be used on the upper and lower surfaces of the middle conductor layer 10 for dispensing at areas which are not the intersection positions of upper and lower good conductors. When the height of the dispensing particles is enough, it can be ensured that the resistance between the middle conductor layer 10 and any of the upper conductor layer 8 and the lower conductor layer 12 is infinite at all times without an external force. Therefore, the elastic isolation layer 9 and the elastic isolation layer 11 can be omitted, saving costs and simplifying the process.

It should be noted that this embodiment is not limited to a plane layout, and may also be made of five layers of elastic fabrics. In this case, the entire device can perfectly fit on a hemispherical surface, thereby achieving position identification on the surface of a hemispherical three-dimensional structure.

Embodiment 3

Figure 3:
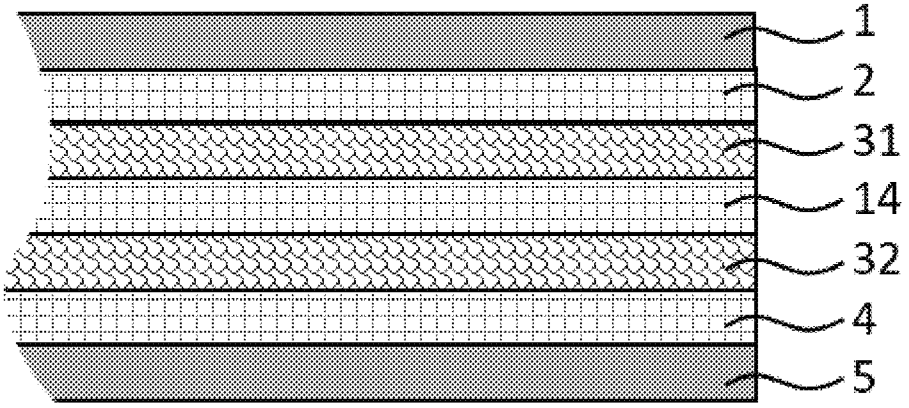
FIG. 3 is a schematic cross-sectional structural view of a capacitive pressure-sensitive touch panel provided by Embodiment 3 of the disclosure.

Referring to FIG. 3, this embodiment provides a fabric single-point position and single-point pressure touch panel. FIG. 3 shows a cross-sectional structure of the touch panel. The only difference between this embodiment and Embodiment 1 is that the middle conductor layer 3 is further divided into an upper middle conductor layer 31 and a lower middle conductor layer 32, as well as an elastic isolation layer 14 therebetween. The measurement of the abscissa and ordinate is the same as in Embodiment 1. The measurement of pressure can be realized by a plate capacitor composed of the upper middle conductor layer 31 and the lower middle conductor layer 32 as well as the elastic isolation layer 14 therebetween. When subjected to pressure, the thickness of the dielectric layer in the plate capacitor, namely the elastic isolation layer 14, decreases, and the effective capacitance value increases. Therefore, the pressure can be inferred by measuring the capacitance value. The material system of this embodiment can be exactly the same as that of Embodiment 1.

Embodiment 4

Figure 4:
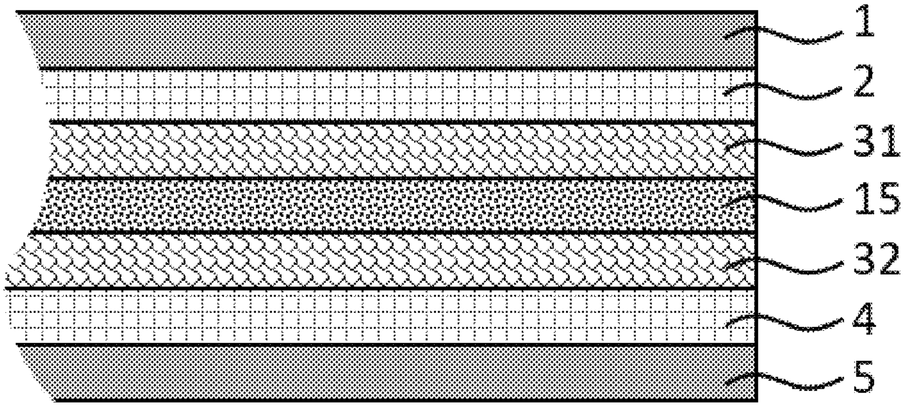
FIG. 4 is a schematic cross-sectional structural view of a resistive and piezoelectric pressure-sensitive touch panel provided by Embodiment 4 of the disclosure.

Referring to FIG. 4, this embodiment provides a fabric single-point position and single-point pressure touch panel. FIG. 4 shows a cross-sectional structure of the touch panel. The only difference between this embodiment and Embodiment 3 is that the elastic isolation layer 2 in the middle of the middle conductor layer 3 is replaced by a piezoresistive material layer 15. In this example, the middle conductor layer is a typical planar piezoresistive pressure sensor. The pressure has a monotonic functional relationship with the resistance, such that the pressure value can be inferred through the resistance. The piezoresistive material layer 15 is preferably made of high-temperature carbonized combed cotton fabrics and silicone composite materials.

Further, the piezoresistive material layer 15 may also be made of a piezoelectric material, and then the middle conductor layer is a typical planar piezoelectric pressure sensor. The pressure has a monotonic functional relationship with the output voltage, such that the pressure value can be inferred through the output voltage. The piezoelectric material layer 15 is preferably made of polyvinylidene fluoride electrospun non-woven fabrics.

By utilizing a variety of conductive composite materials, conductive textile materials, and ordinary fiber yarn fabrics as raw materials and leveraging the design of textile and fiber composite structures, the disclosure produces a position touch device with the light, thin and soft properties of textiles, easy processing, low cost and high position recognition accuracy by using textiles as main base materials and using conventional weaving, knitting, printing, ironing, sewing and embroidery processes in the textile and garment industry.

It should be noted that all materials of the fabric touch panel of the disclosure are made of textile materials, and have the unique properties of textiles such as being light, soft, comfortable, durable, machine washable and dryable, and can be well combined with traditional textile and clothing products, different from traditional hard photoelectric or silicon-based electronic components.

It should be noted that the fabric touch panel of the disclosure has a simple structure with only three or four wires, simplified wiring, an extremely simple circuit, and easy data reading. Compared with matrix scanning of other flexible pressure sensor matrix, the disclosure has unparalleled advantages, minimizing the number of wires and backend circuit complexity, while enhancing device stability.

It should be noted that the fabric touch panel of the disclosure has endless variations, such as position and angle measurement devices, electronic device controllers with planes or curved surfaces or even three-dimensional spaces, such as flexible keyboards, textile keyboards, textile pressure touch panels, etc., and can be flexibly used in various smart homes, smart clothing, IoT devices, and even medical and military products.

It should be noted that compared with other four-wire position fabric touch panels, the disclosure is very simple to process and needs no cumbersome processes to realize the special middle layer with different resistances at different positions. The simplest process only requires embroidery and sewing. In addition, compared with other two-wire position fabric touch panels, the position accuracy of good conductors and the spatial density of good conductor arrangement in the disclosure are much higher than that of fabric touch panels with intermediate layers of different resistances in the existing technology, thereby achieving higher position resolution and detection accuracy.

It should be noted that the middle conductor layer of the disclosure can contain three sub-layers, such that the middle conductor layer can realize the functions of a capacitive pressure sensor, a resistive pressure sensor and a piezoelectric pressure sensor. Therefore, compared with the existing textile touch panel using a four-wire structure that uses four wires to merely measure positions, the disclosure can use four wires to measure positions and pressure simultaneously, and has a simple structure and is stable, reliable, and good in durability.

Based on this, compared with the existing technology, the fabric touch panel of the disclosure at least has the following beneficial effects:

1. The fabric touch panel is thin, soft and comfortable, and can be used to realize single-point position measurement of the entire touch curved surface or plane position.

2. The fabric touch panel is simple in structure, easy to manufacture, low in cost, and easy to produce.

3. The spatial resolution of position recognition is high, and the recognition accuracy is high.

4. The fabric touch panel is strong in bending and shear resistance, resistance to bending fatigue, shear fatigue, compression fatigue, and is machine washable and dryable.

5. The fabric touch panel has simple wiring with only three or four wires, avoiding complex wiring to the greatest extent; and resistance signals are easily read, avoiding complex signal reading means such as matrix scanning, and reducing the occupation of peripheral circuits and computing resources.

6. Three wires can achieve stable single-point pressing position measurement, and four wires can achieve stable measurement of both single-point pressing position and pressure value.

7. The fabric touch panel can be used for various textile-related wearable smart textiles such as smart pillows, smart shoes and insoles, smart school bags, smart cushions, smart mattresses, smart clothing, etc., providing functions such as plane single-point position measurement, plane angle measurement, curved surface single-point position measurement, single point-position measurement on the surface of a three-dimensional object, and composite pressure measurement in the above scenarios.

The above is a detailed description of the preferred implementations of the disclosure, but the disclosure is not limited to the above-mentioned embodiments. Those of ordinary skills in the art can also make various equivalent modifications or substitutions without deviating from the sharing conditions of the gist of the disclosure. These equivalent modifications or substitutions are all included in the scope defined by the claims of the disclosure.

What is claimed is:

1. A fabric touch panel, comprising: an upper conductor layer, a middle conductor layer, and a lower conductor layer, wherein the upper conductor layer comprises a first semiconductor and a plurality of first good conductors sequentially each drawn out from a respective position of the first semiconductor, the plurality of first good conductors are separated from each other such that resistance values drawn out from the first semiconductor by each of the first good conductors are different, and the lower conductor layer comprises a second semiconductor and a plurality of second good conductors sequentially each drawn out from a respective position of the second semiconductor, the plurality of second good conductors are separated from each other such that resistance values drawn out from the second semiconductor by each of the second good conductors are different, the middle conductor layer is a good conductor layer, wherein elastic isolation layers are respectively provided between the middle conductor layer and the upper conductor layer and between the middle conductor layer and the lower conductor layer, and the elastic isolation layers are provided with through holes, and when the upper conductor layer of the fabric touch panel is not touched and not subjected to an external force sufficient to bring the upper conductor layer and the middle conductor layer into contact with each other at a touched position, both the upper conductor layer and the lower conductor layer remain isolated from the middle conductor layer;

when the upper conductor layer of the fabric touch panel is touched and subjected to an external force sufficient to bring the upper conductor layer and the middle conductor layer into contact with each other at a touched position through corresponding through holes, and the lower conductor layer and the middle conductor layer are in contact with each other at a touched position, one of the plurality of first good conductors is in contact with the middle conductor layer through a corresponding through hole, such that the first semiconductor and the middle conductor layer form a first conductive path and a first conductive resistance value obtained by conduction of the first conductive path uniquely corresponds to a coordinate in a first direction of a plane, one of the plurality of second good conductors is in contact with the middle conductor layer through a corresponding through hole, such that the second semiconductor and the middle conductor layer form a second conductive path and a second conductive resistance value obtained by conduction of the second conductive path uniquely corresponds to a coordinate in a second direction of the plane; and the first direction of the plane and the second direction of the plane are different, and coordinates where the external force is applied are determined based on the coordinate in the first direction of the plane and the coordinate in the second direction of the plane.

2. The fabric touch panel according to claim 1, wherein the middle conductor layer comprises an upper middle conductor layer and a lower middle conductor layer, an elastic dielectric layer is arranged between the upper middle conductor layer and the lower middle conductor layer, and the upper middle conductor layer, the lower middle conductor layer and the elastic dielectric layer form a plate capacitor with a three-layer structure.

3. The fabric touch panel according to claim 1, wherein the middle conductor layer comprises an upper middle conductor layer and a lower middle conductor layer, an elastic piezoresistive layer is arranged between the upper middle conductor layer and the lower middle conductor layer, and the upper middle conductor layer, the lower middle conductor layer and the elastic piezoresistive layer form a piezoresistive pressure sensor with a three-layer structure.

4. The fabric touch panel according to claim 1, wherein the middle conductor layer comprises an upper middle conductor layer and a lower middle conductor layer, a piezoelectric layer is arranged between the upper middle conductor layer and the lower middle conductor layer, and the upper middle conductor layer, the lower middle conductor layer and the piezoelectric layer form a piezoelectric pressure sensor with a three-layer structure.

5. The fabric touch panel according to claim 1, wherein the first semiconductor, the second semiconductor, the plurality of first good conductors, the plurality of second good conductors and the middle conductor layer are made of any one of conductive film material, conductive composite material, conductive fiber material, or conductive fiber assembly material.

6. The fabric touch panel according to claim 1, wherein the first semiconductor, the second semiconductor, the first good conductor and the second good conductor form a conductive portion with a specific pattern on a surface or a middle portion of a substrate by any of screen printing, stencil printing, spraying, thermal bonding, weaving, knitting, sewing, or embroidery; or, the first semiconductor, the second semiconductor, the first good conductor and the second good conductor are double-layer or multi-layer flexible conductive films obtained by using any of deposition, chemical plating, or electrochemical plating.

* * * * *